US012787149B2

(12) United States Patent
Yang et al.

(10) Patent No.: US 12,787,149 B2
(45) Date of Patent: Nov. 3, 2026

(54) LOOPBACK MODULE

(71) Applicant: ALL BEST PRECISION TECHNOLOGY CO., LTD., Taoyuan City (TW)

(72) Inventors: Haven Yang, Taoyuan City (TW); Hung-Jhe Yang, Taoyuan City (TW)

(73) Assignee: ALL BEST PRECISION TECHNOLOGY CO., LTD., Taoyuan City (TW)

( * ) Notice: Subject to any disclaimer, the term of this patent is extended or adjusted under 35 U.S.C. 154(b) by 242 days.

(21) Appl. No.: 18/660,243

(22) Filed: May 10, 2024

(65) Prior Publication Data

US 2025/0338388 A1 Oct. 30, 2025

(30) Foreign Application Priority Data

Apr. 26, 2024 (TW) ................................ 113115609

(51) Int. Cl.

*H05K 7/20* (2006.01)
*H05K 1/02* (2006.01)
*H05K 5/00* (2006.01)

(52) U.S. Cl.

CPC ......... *H05K 1/0203* (2013.01); *H05K 7/2039* (2013.01); *H05K 7/20509* (2013.01); *H05K 5/0047* (2013.01); *H05K 2201/10219* (2013.01)

(58) Field of Classification Search

CPC ............... H05K 1/0203; H05K 7/2039; H05K 7/20509; H05K 5/0047; H05K 2201/10219

See application file for complete search history.

(56) References Cited

U.S. PATENT DOCUMENTS 5,522,225 A * 6/1996 Eskandari ............. H10N 10/17 62/3.7
2017/0261712 A1* 9/2017 Ghandour ............ G02B 6/4292
2018/0041282 A1* 2/2018 Chen .................... H04B 10/035
2022/0317394 A1* 10/2022 Huang .................. G02B 6/428
2022/0418080 A1* 12/2022 Ma ....................... H05K 1/0203
2023/0171018 A1* 6/2023 Zhang ................. H04J 14/0227 398/79

FOREIGN PATENT DOCUMENTS

WO WO-0169694 A1 * 9/2001 ......... H05K 7/20836

* cited by examiner

*Primary Examiner* — Jacob R Crum
(74) *Attorney, Agent, or Firm* — Winston Hsu

(57) ABSTRACT

A loopback module includes a housing, a circuit board and a thermoelectric cooler. The circuit board is disposed in the housing. The circuit board includes a loopback circuit, a microcontroller, a temperature sensor and a thermoelectric cooler driver. The thermoelectric cooler is disposed in the housing. The thermoelectric cooler has a first side and a second side located at opposite sides, wherein the first side is in contact with the circuit board and the second side is in contact with the housing. One of the first side and the second side is a cold side and the other one of the first side and the second side is a hot side.

6 Claims, 3 Drawing Sheets

LOOPBACK MODULE

BACKGROUND OF THE INVENTION

1. Field of the Invention

The invention relates to a loopback module and, more particularly, to a loopback module equipped with a thermoelectric cooler.

2. Description of the Prior Art

A loopback module is used for testing the Fiber-Optical transceiver module ports in a datacenter or network system. Data is transmitted from the host to the TX input port of the loopback module, and retimed signal is received by the host via the RX output port of the loopback module. By substituting for a full-featured Fiber-Optical transceiver module, the loopback module provides a cost-effective low loss method for Fiber-Optical Transceiver module port testing. It provides an economical way to exercise Fiber-Optical Transceiver module ports during R&D validation, production testing, and field testing. The loopback module is used to conduct Fiber-Optical transceiver module testing, network repair and power consumption evaluation for the above situations. The loopback module of the prior art uses a chip power resistor as a power consumption component. When the power consumption of the loopback module increate raptly, the chip power resistor will quickly generate high heating above 100° C. However, the loopback module will not handle this over-heating temperature. At the same time, the loopback module needs to cut-off power to cool down, such that the loopback module will lose the evaluation function of sequential operation.

SUMMARY OF THE INVENTION

The invention provides a loopback module equipped with a thermoelectric cooler, so as to solve the aforesaid problems.

According to an embodiment of the invention, a loopback module comprises a housing, a circuit board and a thermoelectric cooler. The circuit board is disposed in the housing. The circuit board comprises a loopback circuit, a microcontroller, a temperature sensor and a thermoelectric cooler driver. The thermoelectric cooler is disposed in the housing. The thermoelectric cooler has a first side and a second side located at opposite sides, wherein the first side is in contact with the circuit board and the second side is in contact with the housing. One of the first side and the second side is a cold side and the other one of the first side and the second side is a hot side.

In an embodiment, the microcontroller and the temperature sensor are coupled to the thermoelectric cooler. The thermoelectric cooler driver is coupled to the thermoelectric cooler and the microcontroller. When the present temperature of the circuit board is lower than or equal to a temperature threshold, the microcontroller controls the thermoelectric cooler driver to periodically convert the first side into one of the cold side and the hot side and periodically convert the second side into the other one of the cold side and the hot side until the present temperature automatically reaches dynamic balance.

In an embodiment, wherein when the present temperature of the circuit board is higher than the temperature threshold, the microcontroller controls the thermoelectric cooler driver to retain the first side as the cold side and retain the second side as the hot side.

In an embodiment, the temperature sensor is configured to monitor the present temperature of the circuit board.

In an embodiment, the housing comprises a top cover and a bottom cover, and the second side of the thermoelectric cooler is in contact with one of the top cover or the bottom cover.

In an embodiment, the contact cover of the second side of the thermoelectric cooler serves as a heating dissipation surface.

In an embodiment, the microcontroller and the thermoelectric cooler driver coupled to the thermoelectric cooler are configured to evaluate power consumption, and the thermoelectric cooler has the cold side for cooling and the hot side for heating simultaneously, such that the thermoelectric cooler consumes more power dissipation than other components. Particularly, we look into these power dissipation can be to evaluate the power consumption of the loopback module.

As mentioned in the above, the invention replaces the chip power resistor of the prior art with the thermoelectric cooler. For further explanation, the invention can use the cold side of the thermoelectric cooler for cooling, use the hot side of the thermoelectric cooler for heating, and use the thermoelectric cooler as a power consumption component. When the present temperature of the circuit board is lower than or equal to the temperature threshold (e.g. 75° C.), it means that the present temperature is normal. At this time, the cold side and the hot side of the thermoelectric cooler can be periodically converted, such that the present temperature of the thermoelectric cooler automatically reaches dynamic balance (e.g. close to 65° C.). When the present temperature of the circuit board is higher than the temperature threshold, it means that the present temperature is too high. At this time, the cold side of the thermoelectric cooler can be retained to contact with the circuit board, and the hot side of the thermoelectric cooler can be retained to contact with the housing, such that the cold side retains to contact with the circuit board, and the hot side retains to contact with the housing for heat dissipation. Accordingly, the loopback module of the invention is suitable for high-power design and will not cut-off power due to overheating.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
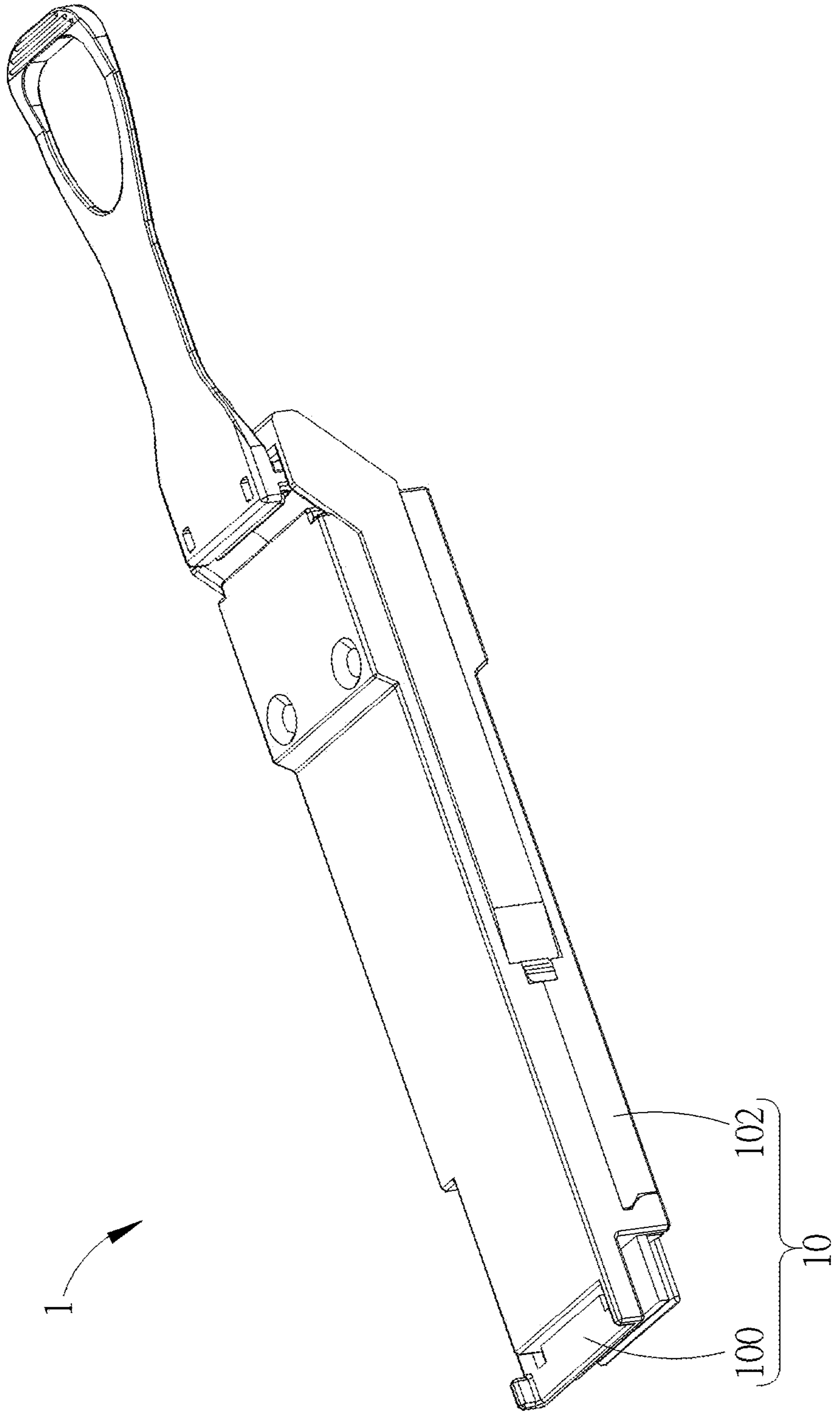
FIG. 1 is a perspective view illustrating a loopback module according to an embodiment of the invention.
Figure 2:
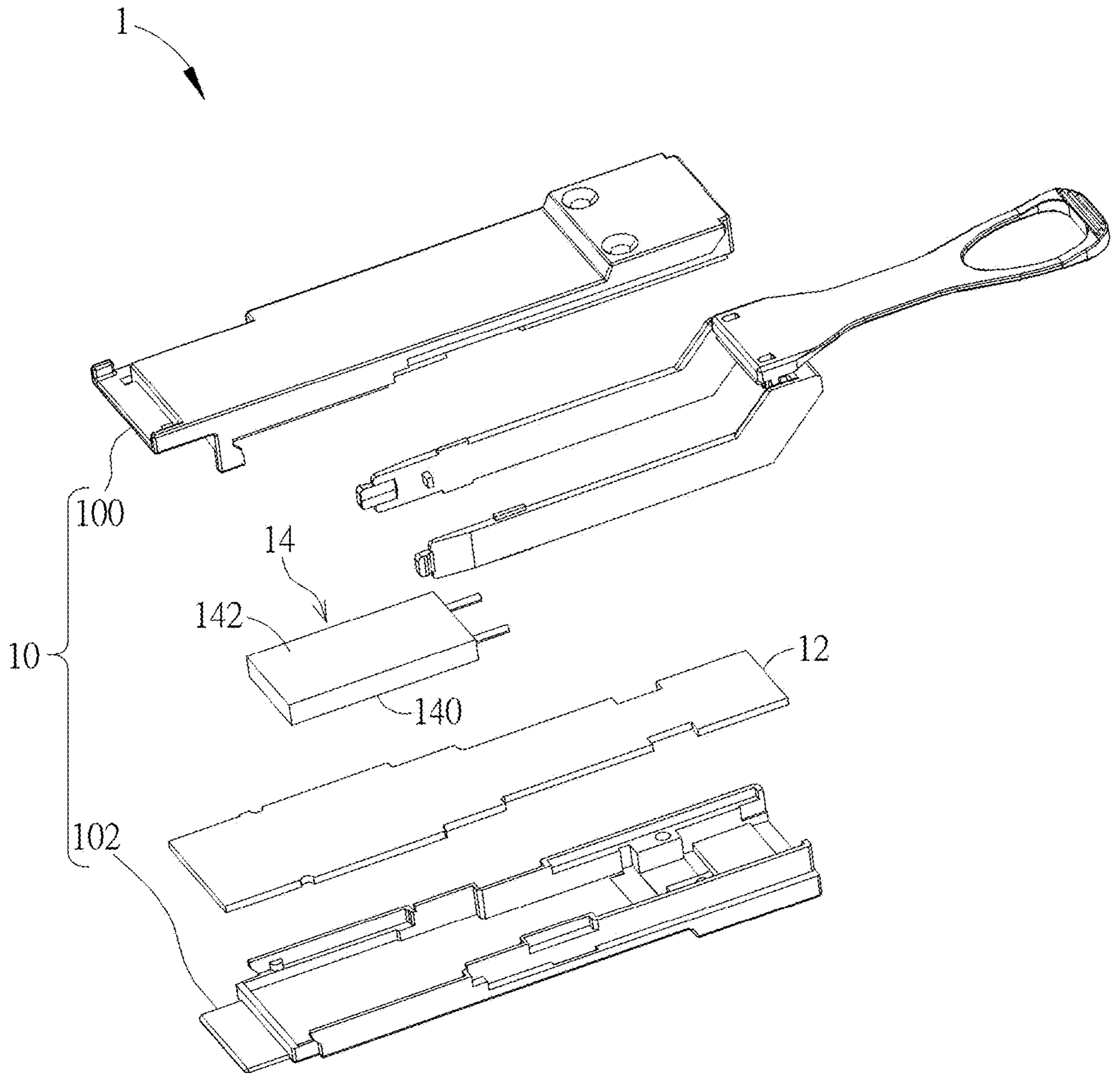
FIG. 2 is an exploded view illustrating the loopback module shown in FIG. 1.
Figure 3:
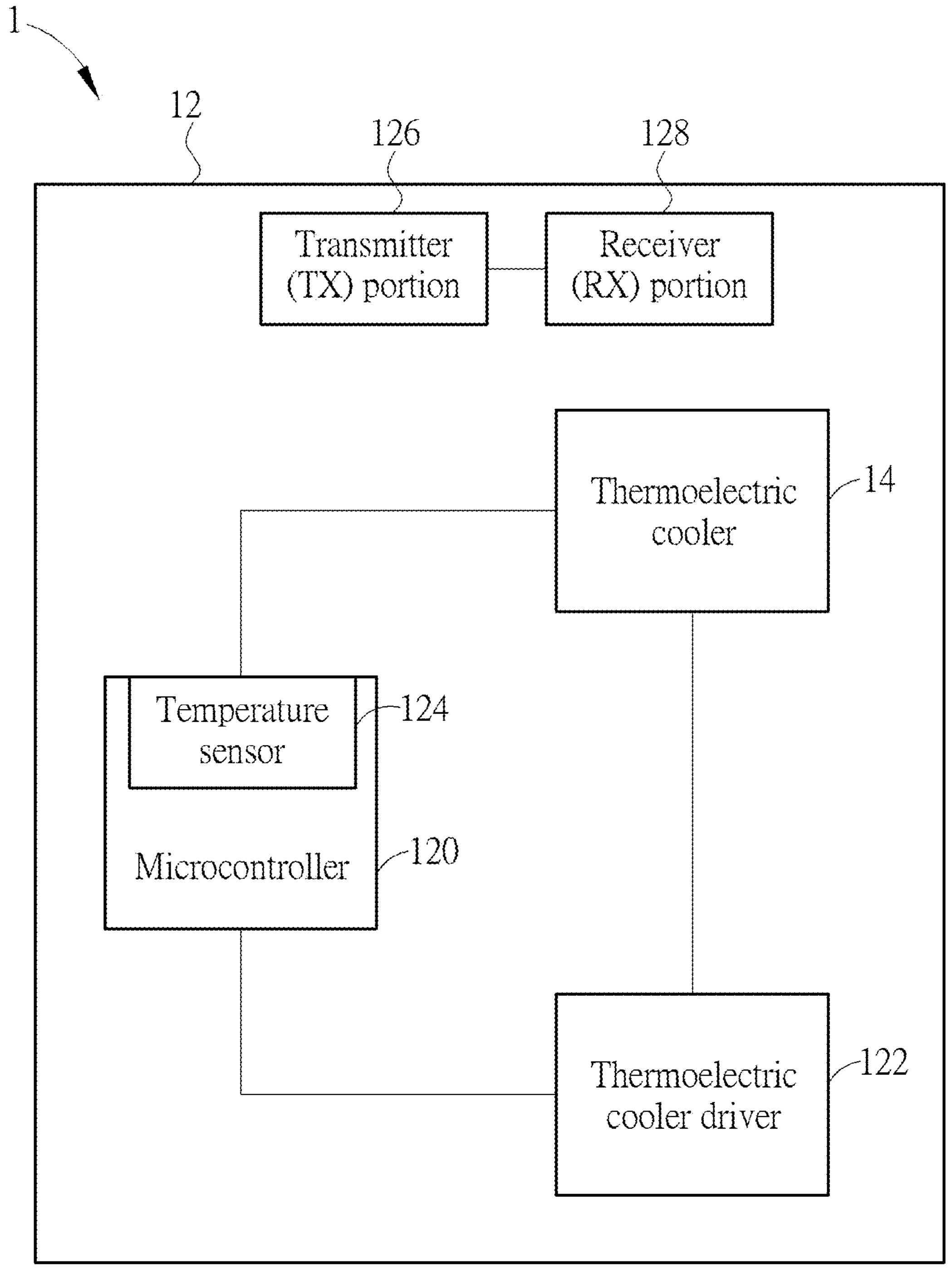
FIG. 3 is a functional block diagram illustrating the loopback module shown in FIG. 1.

Referring to FIGS. 1 to 3, FIG. 1 is a perspective view illustrating a loopback module 1 according to an embodiment of the invention, FIG. 2 is an exploded view illustrating the loopback module 1 shown in FIG. 1, and FIG. 3 is a functional block diagram illustrating the loopback module 1 shown in FIG. 1.

As shown in FIGS. 1 and 2, the loopback module 1 comprises a housing 10, a circuit board 12 and a thermoelectric cooler 14, wherein the circuit board 12 and the thermoelectric cooler 14 are disposed in the housing 10. The loopback module 1 is used for testing the Fiber-Optical transceiver module ports in a datacenter or network system. The loopback module 1 can detect various potential anomalies in the network and evaluate power consumption by the level control signal. In this embodiment, the circuit board 12 comprises a loopback circuit, and the loopback circuit comprises a transmitter (TX) portion 126 and a receiver (RX) portion 128, as shown in FIG. 3. The transmitter (TX) portion 126 transmits data to the receiver (RX) portion 128 for data transmission testing. In general, the loopback module 1 may be further equipped with necessary software and hardware components for operation, and it depends on practical applications.

The thermoelectric cooler 14 has a first side 140 and a second side 142 located at opposite sides, wherein the first side 140 is in contact with the circuit board 12 and the second side 142 is in contact with the housing 10. In this embodiment, the housing 10 may comprise a top cover 100 and a bottom cover 102, but the invention is not so limited. The thermoelectric cooler 14 may be located between the circuit board 12 and the top cover 100. At this time, the second side 142 of the thermoelectric cooler 14 may be in contact with an inner surface of the top cover 100 of the housing 10. It should be noted that the thermoelectric cooler 14 may also be located between the circuit board 12 and the bottom cover 102 according to practical applications. In other words, the second side 142 of the thermoelectric cooler 14 may be in contact with one of the top cover 100 and the bottom cover 102. In another embodiment, a thermal interface material (TIM) may be disposed between the second side 142 of the thermoelectric cooler 14 and the inner surface of the top cover 100, wherein the thermal interface material may be thermal paste or the like.

In this embodiment, one of the first side 140 and the second side 142 may be a cold side and the other one of the first side 140 and the second side 142 may be a hot side. In general, the exterior of the thermoelectric cooler 14 may be composed of two top and bottom insulating ceramic substrates, and the interior of the thermoelectric cooler 14 may be composed of multiple sets of P-type and N-type bismuth telluride based thermoelectric materials and conductive copper electrodes connected in series. When the current enters the thermoelectric material from the electrode or enters the electrode from the thermoelectric material, due to the Peltier effect, heat absorption and heat release will occur at the interface where heterogeneous materials are joined, thereby forming cold side and hot side respectively on opposite sides of the thermoelectric cooler 14. By controlling the direction of the current, it can be determined which side of the first side 140 and the second side 142 is the cold side and which side is the hot side.

As shown in FIG. 3, the circuit board 12 may comprise a microcontroller 120 and a thermoelectric cooler driver 122. The microcontroller 120 is coupled to the thermoelectric cooler 14, and the thermoelectric cooler driver 122 is coupled to the thermoelectric cooler 14 and the microcontroller 120. In this embodiment, the microcontroller 120, the thermoelectric cooler driver 122 and the thermoelectric cooler 14 may be coupled to each other through appropriate circuit layout. Furthermore, the microcontroller 120 may comprise a temperature sensor 124 configured to monitor the present temperature of the circuit board 12.

When the present temperature of the circuit board 12 is lower than or equal to a temperature threshold (e.g. 75° C.), it means that the present temperature is normal. At this time, the microcontroller 120 can control the thermoelectric cooler driver 122 to periodically convert the first side 140 of the thermoelectric cooler 14 into one of the cold side and the hot side and periodically convert the second side 142 of the thermoelectric cooler 14 into the other one of the cold side and the hot side. In other words, when the present temperature is normal, the cold side and the hot side of the thermoelectric cooler 14 can be periodically converted, such that the present temperature of the thermoelectric cooler 14 automatically reaches dynamic balance (e.g. close to 65° C.).

When the present temperature of the circuit board 12 is higher than the temperature threshold, it means that the present temperature is too high. At this time, the microcontroller 120 can control the thermoelectric cooler driver 122 to retain the first side 140 of the thermoelectric cooler 14 as the cold side and retain the second side 142 of the thermoelectric cooler 14 as the hot side. In other words, when the present temperature is too high, the cold side of the thermoelectric cooler 14 can be retained to contact with the circuit board 12, and the hot side of the thermoelectric cooler 14 can be retained to contact with the housing 10, such that the cold side retains to contact with the circuit board 12, and the hot side retains to contact with the housing 10 for heat dissipation. At this time, the second side 142 of the thermoelectric cooler 14 serves as a heat dissipation surface. Accordingly, the loopback module 1 of the invention is suitable for high-power design and will not cut-off power due to overheating. The microcontroller 120 and the thermoelectric cooler driver 122 coupled to the thermoelectric cooler 14 of the invention are configured to evaluate power consumption, and the thermoelectric cooler 14 has the cold side for cooling and the hot side for heating simultaneously, such that the thermoelectric cooler 14 consumes more power than other components. This is the original creation of the invention, unlike other designs that use thermoelectric cooler only for cooling or temperature control.

It should be noted that the aforesaid temperature threshold may be determined according to practical applications.

As mentioned in the above, the invention replaces the chip power resistor of the prior art with the thermoelectric cooler. For further explanation, the invention can use the cold side of the thermoelectric cooler for cooling, use the hot side of the thermoelectric cooler for heating, and use the thermoelectric cooler as a power consumption component. When the present temperature of the circuit board is lower than or equal to the temperature threshold, it means that the present temperature is normal. At this time, the cold side and the hot side of the thermoelectric cooler can be periodically converted, such that the present temperature of the thermoelectric cooler automatically reaches dynamic balance. When the present temperature of the circuit board is higher than the temperature threshold, it means that the present temperature is too high. At this time, the cold side of the thermoelectric cooler can be retained to contact with the circuit board, and the hot side of the thermoelectric cooler can be retained to contact with the housing, such that the cold side retains to contact with the circuit board, and the hot side retains to contact with the housing for heat dissipation. Accordingly, the loopback module of the invention is suitable for high-power design and will not cut-off power due to overheating.

Those skilled in the art will readily observe that numerous modifications and alterations of the device and method may be made while retaining the teachings of the invention.

Accordingly, the above disclosure should be construed as limited only by the metes and bounds of the appended claims.

What is claimed is:

1. A loopback module comprising:
- a housing;
- a circuit board disposed in the housing, the circuit board comprising a loopback circuit, a microcontroller, a temperature sensor and a thermoelectric cooler driver; and
- a thermoelectric cooler disposed in the housing, the microcontroller being coupled to the thermoelectric cooler, the thermoelectric cooler driver being coupled to the thermoelectric cooler and the microcontroller, the thermoelectric cooler having a first side and a second side located at opposite sides, the first side being in contact with the circuit board, the second side being in contact with the housing;
- wherein one of the first side and the second side is a cold side and the other one of the first side and the second side is a hot side;
- wherein when the present temperature of the circuit board is lower than or equal to a temperature threshold, the microcontroller controls the thermoelectric cooler driver to periodically convert the first side into one of the cold side and the hot side and periodically convert the second side into the other one of the cold side and the hot side until the present temperature automatically reaches dynamic balance.

2. The loopback module of claim 1, wherein when the present temperature of the circuit board is higher than the temperature threshold, the microcontroller controls the thermoelectric cooler driver to retain the first side as the cold side and retain the second side as the hot side.

3. The loopback module of claim 1, wherein the temperature sensor is configured to monitor the present temperature of the circuit board.

4. The loopback module of claim 1, wherein the housing comprises a top cover and a bottom cover, and the second side of the thermoelectric cooler is in contact with one of the top cover or the bottom cover.

5. The loopback module of claim 4, wherein the second side of the thermoelectric cooler serves as a heat dissipation surface.

6. The loopback module of claim 1, wherein the microcontroller and the thermoelectric cooler driver coupled to the thermoelectric cooler are configured to evaluate power consumption, and the thermoelectric cooler has the cold side for cooling and the hot side for heating simultaneously, such that the thermoelectric cooler consumes more power than other components.

* * * * *